United States Patent
Björk et al.

[19]

[11] Patent Number: 5,880,643
[45] Date of Patent: Mar. 9, 1999

[54] MONOLITHIC HIGH FREQUENCY VOLTAGE CONTROLLED OSCILLATOR TRIMMING CIRCUIT

[75] Inventors: Christian Björk, Åkarp; Martin Lantz, Malmö; Torbjörn Gärdenfors, Malmö; Bojko Marholev, Lund, all of Sweden

[73] Assignee: Telefonaktiebolaget L M Ericsson, Stockholm, Sweden

[21] Appl. No.: 971,770

[22] Filed: Nov. 17, 1997

[51] Int. Cl.$^6$ .................................................. G01R 23/00
[52] U.S. Cl. ...................... 331/44; 331/177 R; 331/179
[58] Field of Search ................................ 331/177 R, 179, 331/44

[56] References Cited

U.S. PATENT DOCUMENTS

| | | | |
|---|---|---|---|
| 3,319,187 | 5/1967 | Crandall | 331/117 R |
| 3,668,553 | 6/1972 | Dunn et al. | 331/179 |
| 4,186,360 | 1/1980 | Ohashi | 334/55 |
| 4,731,592 | 3/1988 | Sato et al. | 331/108 C |
| 4,973,922 | 11/1990 | Embree et al. | 331/108 D |
| 5,070,311 | 12/1991 | Nicolai | 331/111 |
| 5,166,645 | 11/1992 | Avanic et al. | 331/107 A |
| 5,384,553 | 1/1995 | Takeda et al. | 331/111 |
| 5,434,543 | 7/1995 | Brilka et al. | 331/117 R |
| 5,483,195 | 1/1996 | Brown | 330/254 |
| 5,539,358 | 7/1996 | Hedberg | 331/107 A |

OTHER PUBLICATIONS

"Closing The Loop", Jun. 1993, *Electronics World + Wireless World*, pp. 472–478.

*Primary Examiner*—Siegfried H. Grimm
*Attorney, Agent, or Firm*—Jenkens & Gilchrist

[57] ABSTRACT

A monolithic high frequency voltage controlled oscillator trimming circuit includes a plurality of capacitance loops selectively connected between a first and second differential input of a voltage oscillator active network. A plurality of diodes, connected in series with the respective plurality of capacitance loops, selectively connect respective capacitance loops between the first and second differential input when forward biased. In a similar fashion, the plurality of diodes selectively disconnect the respective capacitance loops from the first and second differential input when reverse biased. A controller applies a forward biasing voltage to the diode of the selected capacitance loop to connect the capacitance loop to the active network of the voltage controlled oscillator and applies a reverse biasing voltage to the diode of the selected capacitance loop to disconnect the capacitance loop from the active network. The diodes used in the capacitance loops form a switch operable at high frequencies and are formed from a bipolar complementary metal oxide semiconductor electro-static discharge protection diode.

9 Claims, 2 Drawing Sheets

MONOLITHIC HIGH FREQUENCY VOLTAGE CONTROLLED OSCILLATOR TRIMMING CIRCUIT

BACKGROUND OF THE INVENTION

1. Technical Field of the Invention

The present invention pertains in general to trimming circuits for voltage controlled oscillators and, more particularly, to a trimming circuit operable at high frequencies and capable of integration with a voltage controlled oscillator on a single semiconductor integrated circuit chip.

2. Description of the Related Art

Trimming a center frequency of a voltage controlled oscillator is typically performed through the use of an external trimming circuit. The trimming circuit is located external to the voltage controlled oscillator on a discrete circuit to simplify adjustment of a resonance frequency. Today, however, there are increased demands to reduce the size and cost of radio equipment particularly in the radio telephone industry. To reduce the size and cost of the radio equipment, more and more functionality is being incorporated onto a single integrated circuit chip. For this reason it is desirable to integrate the trimming circuit onto a single integrated circuit chip together with the voltage controlled oscillator.

Trimming circuits currently can be placed on a single semiconductor chip with the voltage controlled oscillator through the use of a variable capacitor. A digital to analog converter is connected to a variable capacitor and a desired capacitance value associated with a desired center frequency is programmed into the digital to analog converter. The analog output of the digital to analog converter adjusts the variable capacitor in response to the programmed capacitance value thereby varying the resonance frequency of the trimming circuit. In turn, the new resonance frequency adjusts the center frequency of the voltage controlled oscillator.

Problems arise, however, as the supply voltage is decreased or when a wide trimming frequency range is desired. At low power supply voltages increasingly used in radio telephone equipment, for example two and seven tenths volts, it becomes very difficult to obtain the required trimming frequency range with currently available "on-chip" variable capacitors. Furthermore, as the desired trimming frequency range increases, noise created by the digital to analog converter used to adjust the variable capacitor becomes problematic. The inputs to the trimming circuit and the associated voltage controlled oscillator become increasingly sensitive as the trimming frequency range is increased requiring the level of noise created by the digital to analog converter to be kept extremely low. Therefore, as the trimming frequency range increases, it becomes increasingly difficult and expensive to design and manufacture the digital to analog circuit.

Another approach to varying the capacitance of the trimming circuit is through the use of diode switches. While diode switches have been used to connect and disconnect different capacitances to the trimming circuit, the diodes are constructed of discrete PIN diodes separate from the remaining oscillator functionality. The PIN diodes are not integrated onto a semiconductor chip with the oscillator since PIN diodes require a special process to fabricate which is not conducive to bulk integration.

It would be advantageous, therefore, to devise a trimming circuit operable at high frequencies and capable of integration with a voltage controlled oscillator on a single semiconductor chip. It would be further advantageous if such a circuit included a diode switch capable of operation at frequencies above two gigahertz and further capable of integration with the voltage controlled oscillator on a bipolar metal oxide semiconductor.

SUMMARY OF THE INVENTION

The present invention comprises a monolithic high frequency voltage controlled oscillator trimming circuit. The circuit includes a plurality of capacitance loops selectively connected between a first and second differential input of a voltage oscillator active network. A plurality of diodes, connected in series with the respective plurality of capacitance loops, selectively connect respective capacitance loops between the first and second differential input when forward biased. In a similar fashion, the plurality of diodes selectively disconnect the respective capacitance loops from the first and second differential input when reverse biased. A controller applies a forward biasing voltage to the diode of the selected capacitance loop to connect the capacitance loop to the active network of the voltage controlled oscillator and applies a reverse biasing voltage to the diode of the selected capacitance loop to disconnect the capacitance loop from the active network. The diodes used in the capacitance loops form a switch operable at high frequencies and are formed from a bipolar complementary metal oxide semiconductor electro-static discharge protection diode.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
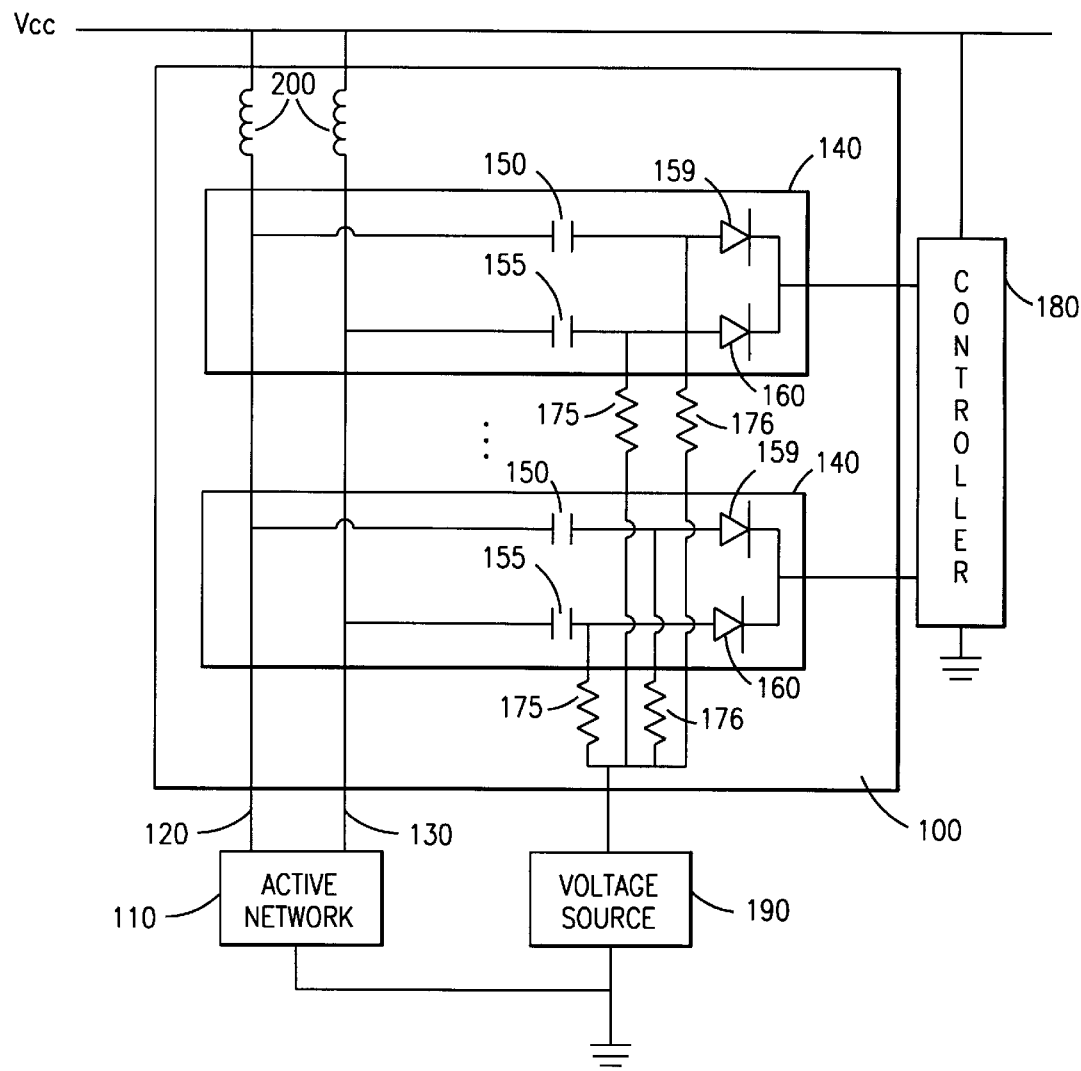
FIG. 1 is a functional block diagram of a high frequency voltage controlled oscillator trimming circuit including a diode switch operable at high frequencies.

Referring now to FIG. 1, there is illustrated a functional block diagram of a high frequency voltage controlled oscillator trimming circuit 100. The trimming circuit 100 is connected to an active network 110 of the voltage controlled oscillator 110 via a differential signal pair comprising a first differential input signal 120 and a second differential input signal 130. The trimming circuit 100 comprises a plurality of capacitance loops 140. Each capacitance loop includes a first capacitor 150, a second capacitor 155, a first diode 159 and a second diode 160. Each capacitance loop 140 is formed by connecting the first differential input signal 120 of the active network 110 to a first terminal of the first capacitor 150. A second terminal of the first capacitor 150 is connected to a first terminal of the first diode 159 and a second terminal of the diode 159 is connected to a first terminal of a second diode 160. A second terminal of the second diode 160 is connected to a first terminal of the second capacitor 155 and a second terminal of the second capacitor 155 is connected to the second differential input signal 130 of the active network 110.

Connected to each capacitance loop 140 is a first resistor 175 and a second resistor 176. The controller 180 is also connected to the second terminal of the first diode 159 and the first terminal of the second diode 160 to apply a biasing voltage. A first terminal of the first resistor 175 is connected to the second terminal of the second diode 160 and the first terminal of the second capacitor 155 while a second terminal of the first resistor 175 is connected to a voltage source 190. A first terminal of the second resistor 176 is connected to the first terminal of the first diode 159 and the second terminal of the first capacitor 150 and a second terminal of the second resistor 176 is connected to the voltage source 190.

The voltage source 190 applies a reference voltage to the second terminal of the second diode 160 and the first terminal of the first diode 159 via the first resistor 175 and the second resistor 176. To selectively connect one or more of the capacitance loops 140 to the active network 110 the controller 180 applies a voltage to the second terminal of the first diode and the first terminal of the second diode such that the voltages applied by the controller 180, the first resistor 175 and the second resistor 176 apply a forward biasing voltage across the first diode 159 and the second diode 160.

In a forward biased state, the first diode 159 and the second diode 160 are electrically conductive resulting in the first capacitor 150 and the second capacitor 155 being selectively connected across the differential signal pair of the active network 110. In addition to providing capacitance for the trimming circuit, the first capacitor 150 and the second capacitor 155 function to block direct current voltages created by the controller 180, the first resistor 175 and the second resistor 176 from being applied to the first differential input signal 120 and the second differential input signal 130. Blocking these voltages, prevents direct current voltages from one capacitance loop 140 from being applied to the first diode 159 and the second diode 160 of other capacitance loops 140.

In a reverse biased state, the first diode 159 and the second diode 160 are nonconductive. Furthermore, values for the first resistor 175 and the second resistor 176 are chosen such that the first resistor 175 and the second resistor 176 have relatively high resistance values, for example on the order of several thousand ohms. Therefore, although there is an electrical path completed between the first differential input signal 120 and the second differential input signal 130 through the first resistor 175 and the second resistor 176 when the first diode 159 and the second diode 160 are reverse biased, the high resistance values result in the capacitance loop 140 being essentially disconnected from the differential input pair.

To operate at relatively high frequencies, for example above two gigahertz, the first diode 159 and the second diode 160 require specific operating characteristics. An ideal diode for use in this application posses the following characteristics: a low series resistance $r_s$ during operation in a forward biased state, a long transit time $1/\tau$ and a low reverse biased junction capacitance $C_{jo}$. Although expensive semiconductor devices such as Gallium Arsenide (GaS) could be used to construct an integrated circuit chip incorporating the trimming circuit and the voltage controlled oscillator, such a device would be prohibitively expensive.

In the preferred embodiment of the present invention, an inexpensive diode meeting these requirements is fabricated using a Bipolar Complementary Metal Oxide Semiconductor (BiCMOS) manufacturing process. Although not used as circuit switches, diodes currently used for Electo-Static Discharge (ESD) protection in bipolar complementary metal oxide semiconductors posses the desired characteristics. For example, in the Philips Qubic 1 silicon chip manufacturing process, an electro-static discharge protection diode catalogued as DB100W posses a series resistance $r_s$ equal to three ohms in the forward biased state, a $\tau$ equal to five nanoseconds and a reverse bias junction capacitance $C_{jo}$ equal to one hundred twenty six femtofarads. These values are sufficient for operation in the preferred embodiment of the present invention at frequencies above three hundred megahertz. In the reversed bias state, this diode has a junction capacitance of approximately fifty femtofarads at a reverse bias voltage of approximately one volt. Further information regarding the design and operation of these electro-static discharge protection diodes can be found in the Philips Qubic 1 design manual or other similar bipolar complementary metal oxide semiconductor design manuals.

In addition to operating at the desired frequencies, bipolar complementary metal oxide semiconductor electro-static discharge protection diodes of this type are inexpensive to manufacture and are easily incorporated into a single semiconductor chip with other functionality of the transceiver. Although the use of bipolar complementary metal oxide semiconductor diodes for electro-static discharge protection is well known, their use as a diode for providing high speed "on-chip" switching functionality has not previously been taught in the industry.

Figure 2:
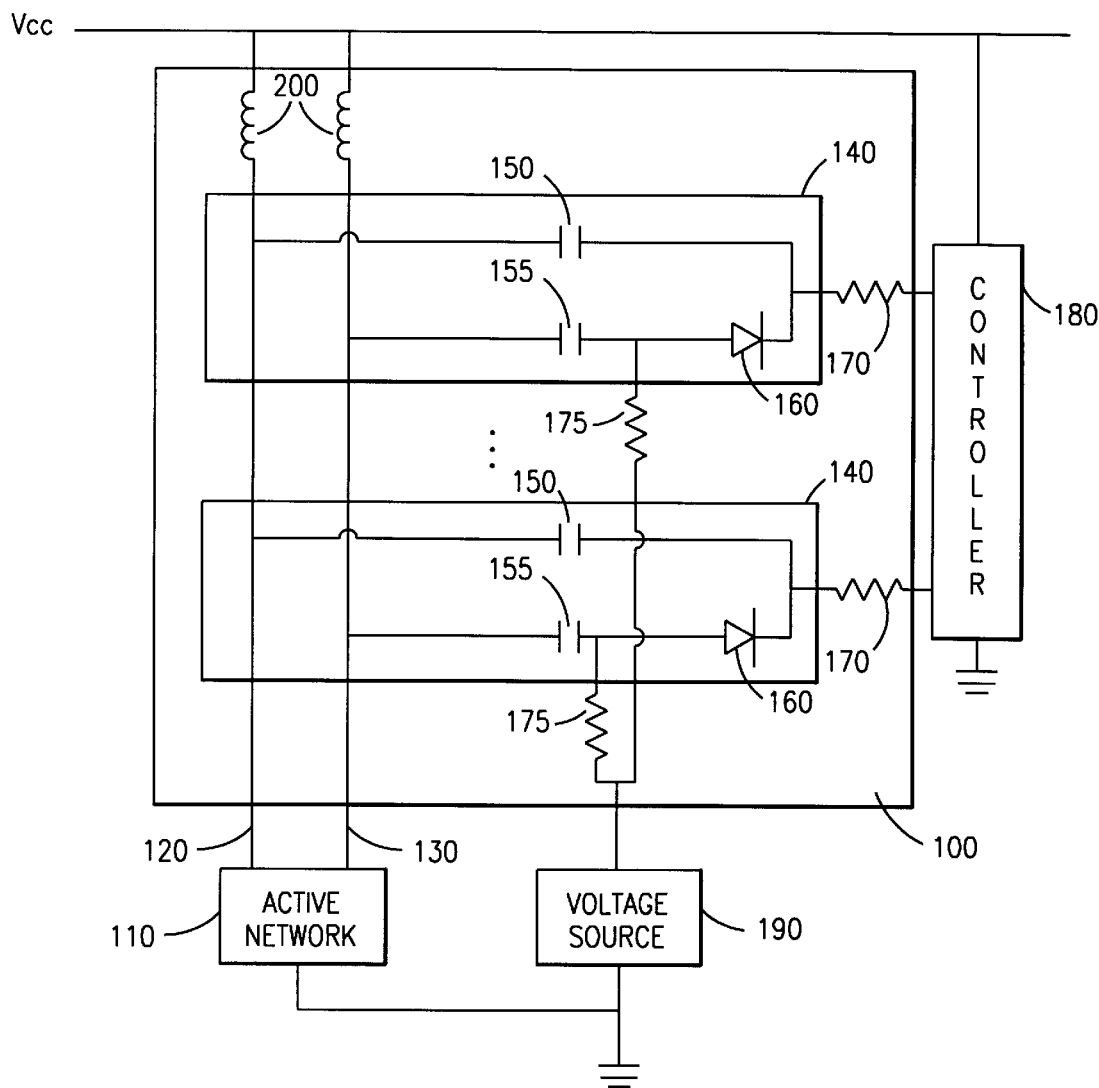
FIG. 2 is functional block diagram of an alternative embodiment of the voltage controlled oscillator trimming circuit described in FIG. 1.

Referring additionally now to FIG. 2, there is illustrated a functional block diagram of an alternative embodiment of the voltage controlled oscillator timing circuit described in FIG. 1.

The embodiment described in FIG. 1, depicts the use of a first diode 159 and a second diode 160. While two diodes are used to provide balancing between the first differential input signal 120 and the second differential input signal 130 and also to provide better isolation, an alternative embodiment uses a single diode instead. The use of one diode is accomplished by removing the first diode 159 and the associated second resistor 176.

The alternative embodiment also includes the addition of resistor 170 whose first terminal is connected to the controller 180 and whose second terminal is connected to the first terminal of the diode 160. The alternative embodiment functions in a similar manner as the first embodiment described in FIG. 1, however, it has the advantage of requiring fewer components and has a lower series resistance since only one diode is used. On the other hand, the first embodiment has the advantage of providing better isolation and balances the differential signals.

The preferred embodiments described in FIGS. 1 and 2 depict the cathode of the first diode 159 and the cathode of the second diode 160 as being connected to the controller 180 or the terminal of the resistor 170 respectively, in another alternative embodiment (not shown), the anode of the first diode 159 and the anode of the second diode 160 are instead connected to the controller 180 or the terminal of the resistor 170 respectively. In this alternative embodiment, the polarity of voltages applied to the first diode 159 and the second diode 160 by the controller 180 and the voltage source 190 are reversed accordingly.

Although preferred embodiments of the method and apparatus of the present invention have been illustrated in the accompanying Drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A monolithic high frequency voltage controlled oscillator trimming circuit comprising:

a plurality of capacitance loops selectively connected between a first and second differential input of a voltage oscillator active network;

a plurality of diodes connected in series with the respective plurality of capacitance loops, each diode in the plurality of diodes for selectively connecting a respective capacitance loop from the plurality of capacitance loops between the first and second differential input; and a controller for applying a forward biasing voltage to the diode of the selected capacitance loop.

2. The circuit recited in claim 1, further comprising a voltage source connected to a first terminal of each diode of the plurality of diodes, the voltage source for applying a reference voltage to the first terminals of the diodes.

3. The circuit recited in claim 2, wherein each capacitance loop includes a first and a second diode connected in series.

4. The circuit recited in claim 3, further comprising:

a first resistor connected between the voltage source and the first terminal of the first diode; and a second resistor connected between the voltage source and the second terminal of the second diode.

5. The circuit recited in claim 2, further comprising:

a first resistor connected between the voltage source and the first terminal of each diode of the plurality of diodes; and a second resistor connected between the controller and a second terminal of each diode of the plurality of diodes.

6. The circuit recited in claim 5, wherein each capacitance loop comprises:

a first capacitor connected between the first differential input and the second terminal of the diode, the first capacitor for isolating the first differential input from a direct current voltage applied to the second terminal of the diode; and a second capacitor connected between the second differential input and the first terminal of the diode, the second capacitor for isolating the second differential input from a direct current voltage applied to the first terminal of the diode.

7. The circuit recited in claim 1, wherein the plurality of diodes are bipolar complementary metal oxide semiconductor diodes.

8. The circuit recited in claim 1, wherein the diodes are bipolar complementary metal oxide semiconductor electro-static discharge protection diodes.

9. A switch, operable at high frequencies, for connecting a first portion of an integrated circuit to a second portion of the integrated circuit comprising:

a bipolar complementary metal oxide semiconductor electro-static discharge protection diode;

a first capacitor connected between the first portion of the integrated circuit and a first terminal of the diode, the capacitor for isolating the first portion of the integrated circuit from a direct current voltage applied to the first terminal of the diode; and a second capacitor connected between the second portion of the integrated circuit and a second terminal of the diode, the capacitor for isolating the second portion of the integrated circuit from a direct current voltage applied to the second terminal of the diode.

* * * * *